BRIDGE-T OSCILLATOR CIRCUIT WITH GAIN CONTROL
Original Filed Aug. 10, 1964
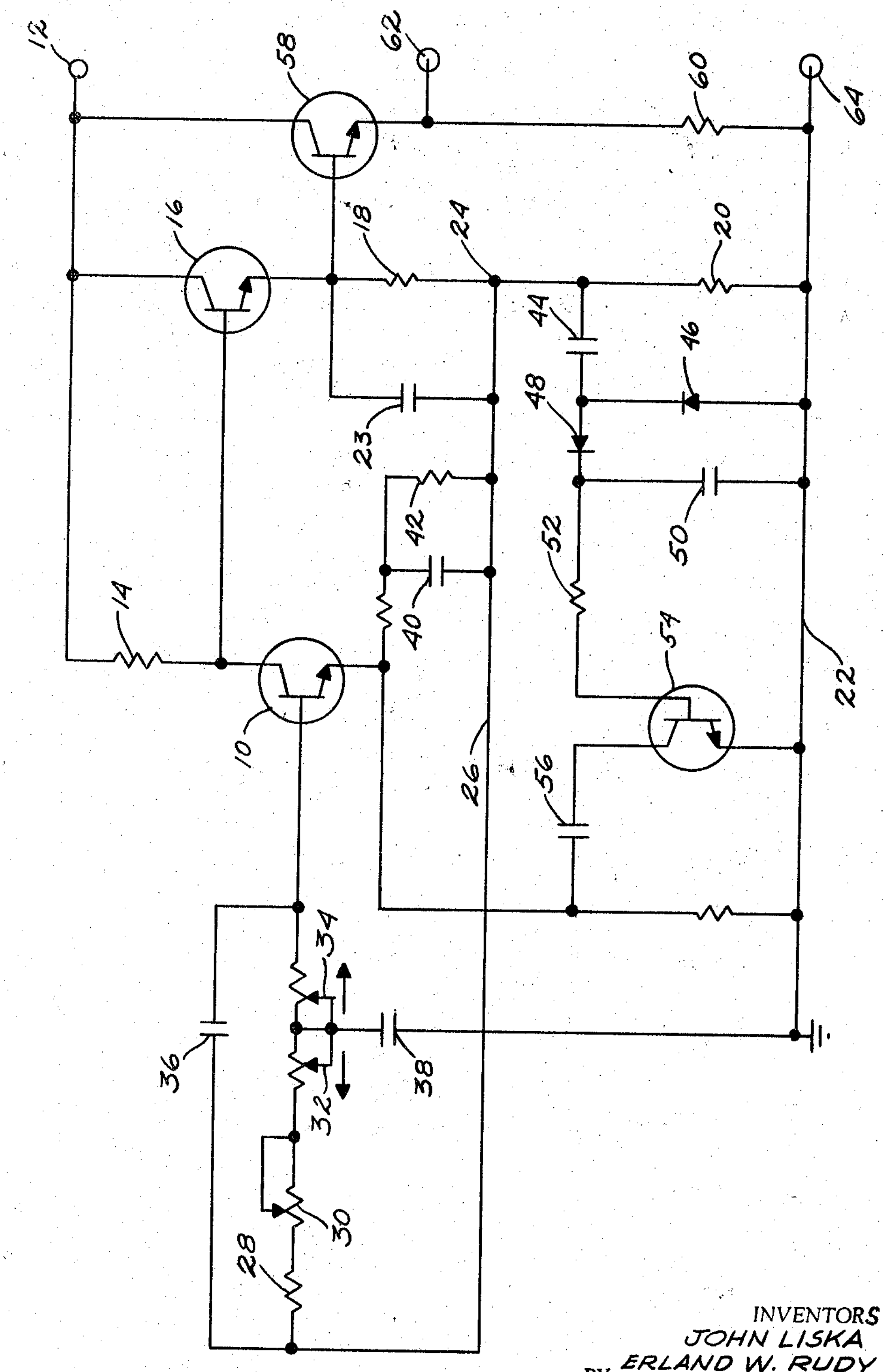
INVENTORS
JOHN LISKA
ERLAND W. RUDY
BY
Robert C. Smith
ATTORNEY United States Patent Office 3,317,854
Patented May 2, 1967

3,317,854
BRIDGE-T OSCILLATOR CIRCUIT WITH GAIN CONTROL

John Liska, Panorama City, and Erland W. Rudy, Granada Hills, Calif., assignors to The Bendix Corporation, a corporation of Delaware Continuation of application Ser. No. 388,396, Aug. 10, 1964. This application May 10, 1966, Ser. No. 554,265
7 Claims. (Cl. 331—110)

This invention relates to oscillators, and more particularly to a free-running oscillator of the bridge-T type.

The present application is a continuation of our application Ser. No. 388,396 filed Aug. 10, 1964, now abandoned.

There is a need for an oscillator which is comparatively small, light and inexpensive and which can be made to operate over a very wide frequency band. Oscillators are available which will operate over a substantial frequency band, but they typically involve either a variable capacitor or a variable inductor, or require switching means for interjecting selected capacitors or inductors to establish a number of ranges over the desired frequency band. In the latter case, variable resistors may be used to accomplish the frequency variations within each range. Such arrangements introduce size and complexity into the oscillator which it is often difficult to avoid. In most cases, it is also desirable that the wide band oscillator used have a comparatively uniform output over its range. It is therefore an object of the present invention to provide an oscillator circuit which has an output frequency variable over a wide band without the need for switching or varying of reactance components.

It is another object of the present invention to provide an oscillator whose output frequency is variable over a wide band by variable resistance means and whose voltage output is substantially uniform over said frequency band.

It is another object of the present invention to provide an oscillator which meets the above objectives and in which said substantially uniform voltage output is assured through the use of an amplified automatic gain control signal in one of its feedback loops.

It is a further object of the present invention to provide an oscillator meeting the above objectives and in which means are provided to isolate the resonant circuits of said oscillator such that they are not adversely affected by loading effects.

Other objects and advantages will become apparent from the following specification taken in connection with the accompanying drawing, in which:

The single figure is a schematic diagram of an oscillator circuit incorporating our invention.

Referring now to the drawing, the principal amplifying element of the oscillator is a transistor 10 which has its collector voltage supplied from a power source (not shown) connected to a terminal 12, through a collector resistor 14. The output of the transistor 10 appears at its collector where it is directly coupled to the base of a transistor 16 which is connected in the circuit in an emitter-follower configuration such that the oscillator output really appears across a pair of resistors 18 and 20 connected between its emitter and a ground line 22. Resistor 18 is bypassed by means of a conventional capacitor 23. The junction between these resistors will be designated as point 24. The voltage appearing between point 24 and ground is the feedback voltage, and this voltage is supplied to both a negative and a positive feedback loop in addition to an automatic gain control loop connected to control the positive feedback. The negative feedback signal is connected through a conductor 26 to one end of a resistance network including resistor 28, rheostat 30, potentiometers 32 and 34, and to a capacitor 36 connected in parallel with said network, and from thence to the base of transistor 10. A capacitor 38, which forms part of the frequency-determining network, is connected between the sliders of potentiometers 32 and 34 and ground. Coarse adjustments on frequency are provided by potentiometers 32 and 34, which are ganged to move simultaneously as shown by the arrows, and a further, fine, adjustment is provided by rheostat 30.

The voltage at point 24 is also connected, through a capacitor 40 and a resistor 42, to the emitter of transistor 10. So connected, this feedback voltage provides positive feedback which, of course, is required to provide oscillation. The magnitude of the oscillator swings, or voltage excursions, is controlled by an automatic gain control circuit which varies the effective magnitude of this positive feedback signal. The feedback voltage across resistor 20 is supplied through a coupling capacitor 44 to a diode voltage doubler circuit consisting of two diodes 46 and 48. This feedback voltage, thus increased in magnitude, is filtered by means of a capacitor 50 and is connected through a resistor 52 to the base of a transistor 54. The emitter of transistor 54 is grounded, and its collector is connected, through a capacitor 56, to the emitter of transistor 10. The amplified feedback signal appearing at the emitter of transistor 10, which is an alternating voltage, appears at the collector of transistor 54 through coupling capacitor 56. If the oscillations become too large, this automatic gain control signal will increase the proportion of the positive feedback signal flowing through transistor 54 to ground and thereby reduce the effective positive feedback signal, thus reducing the magnitude of the oscillations. If they become smaller than desired, the automatic gain control signal will be reduced, thus permitting a larger proportion of the positive feedback signal to drive the transistor 10 and thereby causing an increase in the magnitude of the oscillations.

To provide a desired isolation between the oscillator and subsequent stages, the oscillator output appearing at the emitter of transistor 16 may be directly coupled through a separate emitter-follower amplification stage including a transistor 58. The collector of transistor 58 is connected to power terminal 12, and its emitter is connected through a load resistor 60 to the ground line 22. The output of transistor 58 thus appears across output terminals 62 and 64. With this amplification stage present the oscillator is much less susceptible to loading effects which might occur in associated circuits downstream of terminals 62 and 64. If it appears that such loading effects are not a problem, this stage may be eliminated, and the output can be taken directly across resistors 18 and 20.

While only one embodiment is shown and described herein, modifications may be made to suit the requirements of any specific application.

We claim:

1. An oscillator circuit comprising a power source;
   - a first transistor having base, emitter, and collector electrodes connected to said power source;
   - a second transistor connected to receive the output of said first transistor and connected to said power source in an emitter-follower relationship wherein a voltage divider circuit is connected in the emitter circuit of said second transistor;
   - a resonant circuit of bridge-T configuration connected to said voltage divider and connected to supply a negative feedback signal to the base of said first transistor, said resonant circuit including a first capacitor, a plurality of resistance means including potentiometer means connected in parallel with said capacitor, and a second capacitor connected between the sliders of two of said potentiometers and ground;

means including a capacitor and a resistor connected in parallel therewith connected to said voltage divider and to the emitter of said first transistor for supplying a positive feed-back signal to said first transistor to support and sustain oscillations; and automatic gain control means connected between said voltage divider and the emitter of said first transistor including a third transistor having its output capacitively coupled to the emitter of said first transistor and its input connected to said voltage divider through a coupling capacitor, a diode voltage doubler circuit and a filter circuit.

2. An oscillator circuit comprising a power source;

a first transistor having base, emitter, and collector electrodes connected to said power source;

a second transistor connected to receive the output of said first transistor and connected to said power source in an emitter-follower relationship wherein a voltage divider circuit is connected in the emitter circuit of said second transistor;

a resonant circuit of bridge-T configuration connected to said voltage divider and connected to supply a negative feedback signal to the base of said first transistor, said resonant circuit including a first capacitor, a plurality of resistance means including variable resistance devices connected in parallel with said capacitor, and a second capacitor connected between the sliders of two of said variable resistance devices and ground;

means including a capacitor and a resistor connected in parallel therewith connected to said voltage divider and to the emitter of said first transistor for supplying a positive feedback signal to said first transistor to support and sustain oscillations; and automatic gain control means connected between said voltage divider and the emitter of said first transistor.

3. In an oscillator circuit comprising a power source and a first amplifying device connected to said power source;

a second amplifying device having a first electrode connected to said power source, a second electrode connected to receive the output of said first amplifying device, and a third electrode;

resistance means connected between said third electrode and a common voltage reference point;

a resonant circuit of bridge-T configuration connected to said resistance means and to the input of said first amplifying device to provide a negative feedback loop for said oscillator;

means including parallel-connected capacitance and resistance devices connected to said resistance means and to said first amplifying device to provide a positive feedback signal to said first amplifying device; and automatic gain control means including a third amplifying device having a first electrode connected to receive an input signal from said resistance means, a second electrode connected to said common voltage reference point, and a third electrode capacitively coupled to said positive feedback signal producing means and to said first amplifying device such that when the magnitude of the position feedback signal appearing at said first amplifying device varies from a desired value, a proper portion of said positive feedback signal may be connected to said common voltage reference point through said third amplifying device to bring said signal to the desired value.

4. An oscillator circuit as set forth in claim 3 wherein said automatic gain control means includes a voltage doubling rectifier circuit connected between said resistance means and the input of said third amplifying device.

5. An oscillator circuit as set forth in claim 3 wherein said resistance means constitutes a voltage divider and said positive feedback signal means, said resonant circuit, and said automatic gain control are all connected to a single intermediate point on said voltage divider, said point establishing a voltage bias level for an electrode of said first amplifying device.

6. An oscillator circuit as set forth in claim 3 wherein said resonant circuit includes a first capacitor, a plurality of series-connected variable resistance devices connected in parallel with said capacitor, and a second capacitor connected between two of said variable resistance devices and said common voltage reference point.

7. An oscillator circuit as set forth in claim 3 wherein said first amplifying device and said second amplifying device are directly coupled first and second transistors, said second transistor being connected in a common emitter configuration, said resonant circuit is connected to the base electrode of said first transistor and to said common voltage reference point and said parallel-connected resistance and capacitance devices and said automatic gain control means are effectively connected to the emitter of said first transistor.

No references cited.

ROY LAKE, *Primary Examiner.*

J. KOMINSKI, *Assistant Examiner.*